United States Patent
Kang et al.

(10) Patent No.: US 7,791,934 B2
(45) Date of Patent: Sep. 7, 2010

(54) METHOD FOR DRIVING MULTI-LEVEL DATA TO A PHASE CHANGE MEMORY DEVICE

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 139 days.

(21) Appl. No.: 12/146,559

(22) Filed: Jun. 26, 2008

(65) Prior Publication Data
US 2009/0040814 A1   Feb. 12, 2009

(30) Foreign Application Priority Data
Aug. 10, 2007   (KR) ............... 10-2007-0080657

(51) Int. Cl.
*G11C 11/00*   (2006.01)
(52) U.S. Cl. ...................... 365/163; 365/148
(58) Field of Classification Search .......... 365/163, 365/148, 189.16
See application file for complete search history.

(56) References Cited
U.S. PATENT DOCUMENTS
6,751,114 B2   6/2004   Gilton et al.
7,639,526 B2 *  12/2009  Pellizzer et al. ............ 365/163
2006/0126380 A1 *  6/2006  Osada et al. ................ 365/163
2007/0236987 A1 * 10/2007  Cho et al. ................... 365/163
2007/0274121 A1 * 11/2007  Lung et al. .................. 365/148

FOREIGN PATENT DOCUMENTS
WO   2006-128896 A1   12/2006

* cited by examiner

*Primary Examiner*—Vu A Le
(74) *Attorney, Agent, or Firm*—Ladas & Parry LLP

(57) ABSTRACT

A phase change memory device including a phase change resistor senses a crystallization state that is changed according to supplied currents to store data corresponding to the crystallization state. The phase change memory device may receive and store multi-level data. The multi-level data is driven to the phase change memory device by reading cell data of a selected cell. The cell data is compared to multi-level data to be written to the cell. A high resistance reset state is written to the phase change resistor by applying a write voltage that corresponds to a threshold voltage when the cell data is different from the multi-level data. The multi-level data is then written to the phase change resistor by writing and verifying a set state that corresponds to the multi-level data.

29 Claims, 13 Drawing Sheets

METHOD FOR DRIVING MULTI-LEVEL DATA TO A PHASE CHANGE MEMORY DEVICE

CROSS-REFERENCE TO RELATED APPLICATIONS

This application is based upon and claims the benefit of priority to Korean Patent Application No. 10-2007-80657, filed on Aug. 10, 2007, the entire contents of which are incorporated herein by reference.

BACKGROUND OF THE INVENTION

The present invention relates generally to a method for driving a phase change memory device, and more particularly, to a technology for writing multi-level data to a phase change memory device having a phase change resistor.

Nonvolatile memory, including magnetic memory and phase change memory (PCM), has a data processing speed similar to that of volatile Random Access Memory (RAM) and conserves data even after power is turned off.

FIGS. 1a and 1b are diagrams showing a conventional phase change resistor (PCR) 4.

The PCR 4 comprises a phase change material (PCM) 2 formed between a top electrode 1 and a bottom electrode 3. A high temperature is generated in the PCM 2 when a voltage and a current are transmitted causing an electric conductive state change depending on the resistance of the PCM 2. The PCM may include AgLnSbTe. The PCM 2 includes chalcogenide having chalcogen elements (S, Se, Te) as a main ingredient, and more specifically a germanium antimonic tellurium (Ge2Sb2Te5) consisting of Ge—Sb—Te.

FIGS. 2a and 2b are diagrams showing the principle operation of the conventional PCR 4.

As shown in FIG. 2a, the PCM 2 can be crystallized when a low current less than a threshold value flows in the PCR 4. As a result, the PCM 2 is crystallized as a low resistant material.

As shown in FIG. 2b, the PCM 2 has a temperature higher than a melting point when a high current more than a threshold value flows in the PCR 4. As a result, the PCM 2 becomes amorphous as a high resistant material.

In this way, the PCR 4 is configured to store nonvolatile data which corresponds to the two resistance states. Data "1" refers to when the PCR 4 is at a low resistance state and data "0" refers to when the PCR 4 is at a high resistance state. As a result, the logic states of the two data can be stored.

FIG. 3 is a diagram showing a write operation of a conventional phase change resistant cell.

Heat is generated when current flows between the top electrode 1 and the bottom electrode 3 of the PCR 4 for a given period of time. As a result, the PCM 2 is changed to a crystalline or amorphous state depending on a temperature given to the top electrode 1 and the bottom electrode 3.

When a low current flows for a given period of time, the PCM 2 changes to a crystalline state due to low temperature heating so that the PCR 4, which is a low resistor, is at a set state. On the other hand, when a high current flows for a period of given time, the PCM 2 changes to an amorphous state due to high temperature heating so that the PCR 4, which is a high resistor, is at a reset state. A difference between two phases is represented by an electric resistance change.

A low voltage is applied to the PCR 4 for a long time to write the set state in a write mode. Conversely, a high voltage is applied to the PCR 4 for only a short time to write the reset state in the write mode.

When a write operating cycle starts in the conventional phase change memory device, new data is written to the selected phase change resistor PCR. As a result, the number of reset and set write operations increases and increases power consumption. This increase results in a degradation of cells and deterioration in a write characteristic of the cells.

Each cell included in a cell array has different process, device, and design conditions such that read current distribution for each cell is different. That is, the distribution of a set current Iset and a reset current Ireset becomes broad in comparison to a read current.

Based on a reference current Iref, some cells may have read currents that overlap with each other. As a result, some cells may fail when the reset current Ireset and the set current Iset are distinguished by a single reference current Iref and the set current Iset and the reset current Ireset overlap.

SUMMARY OF THE INVENTION

Disclosed is a method for driving a phase change memory device.

Embodiments of the present invention are directed to reading/writing multi-level data to a phase change memory device having a phase change resistor.

Embodiments of the present invention are directed to reducing the number of reset and set operations occurring in a phase change memory device having a phase change resistor to improve a write operation characteristic.

Embodiments of the present invention are directed to changing a multi-level write condition when an initial cell write characteristic is different in order to obtain a normal multi-level write condition.

According to an embodiment of the present invention, a method for driving a phase change memory device having a phase change resistor and sensing a change in a crystallization state of the phase change resistor according to currents applied to the phase change resistor to store data corresponding to crystallization state, the method comprises: reading cell data of a selected cell; comparing the cell data with multi-level data to be written to the cell; applying a write voltage corresponding to a threshold voltage to the cell to write a high resistance reset state to the phase change resistor when the cell data is different from the multi-level data; and writing and verifying a set state corresponding to the multi-level data.

DESCRIPTION OF SPECIFIC EMBODIMENTS

Figure 1A:
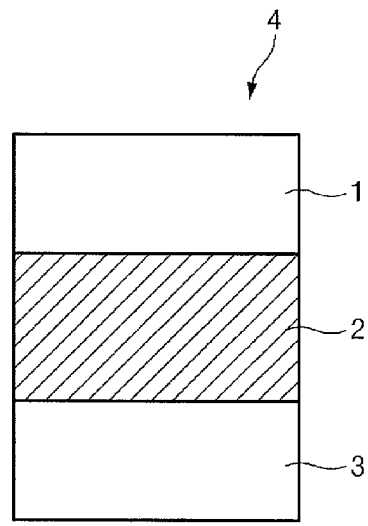
FIGS. 1a and 1b are diagrams showing a conventional phase change resistor.
Figure 1B:
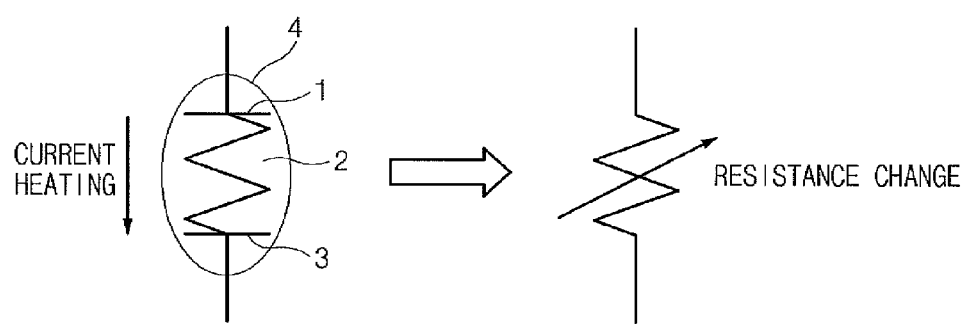
Figure 2A:
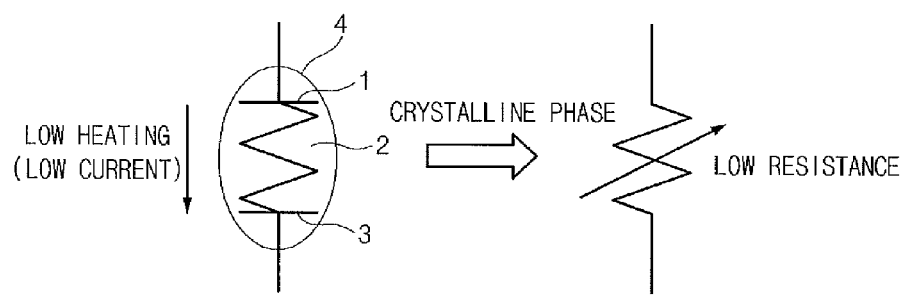
FIGS. 2a and 2b are diagrams showing a principle operation of the conventional phase change resistor.
Figure 2B:
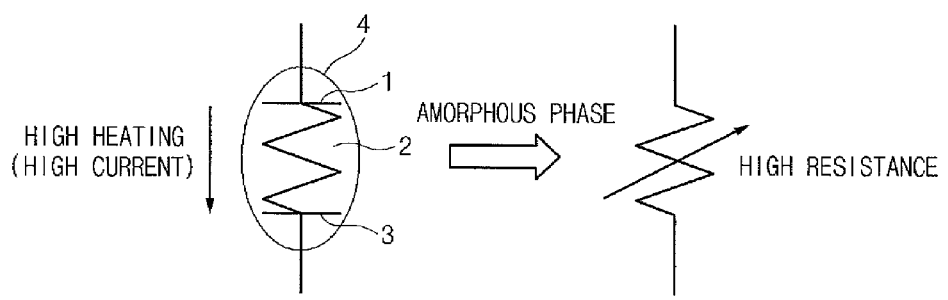
Figure 3:
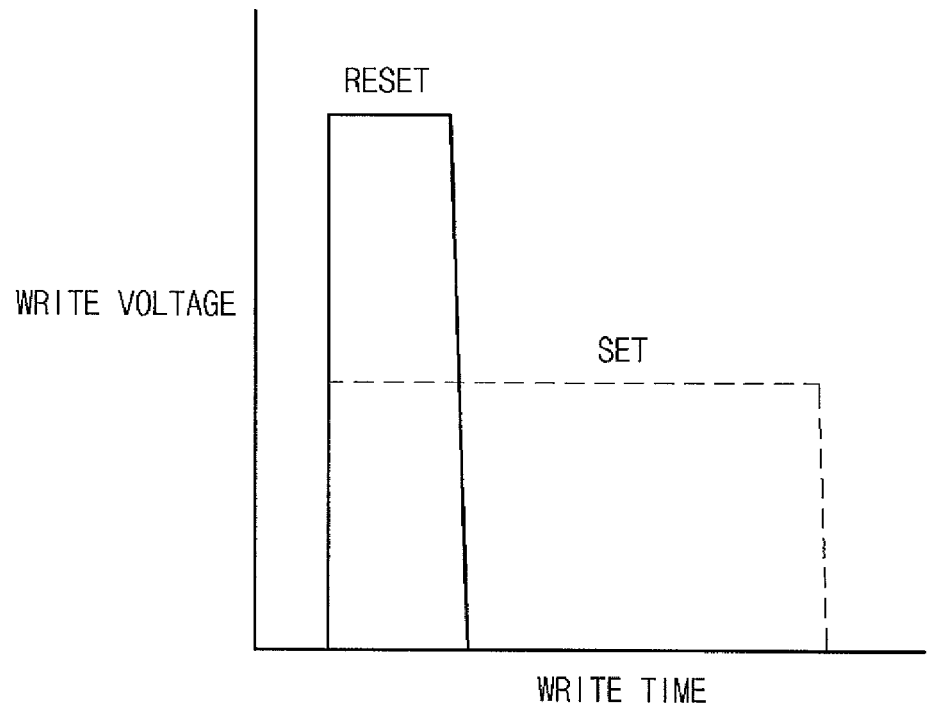
FIG. 3 is a diagram showing a write operation of a conventional phase change resistant cell.
Figure 4:
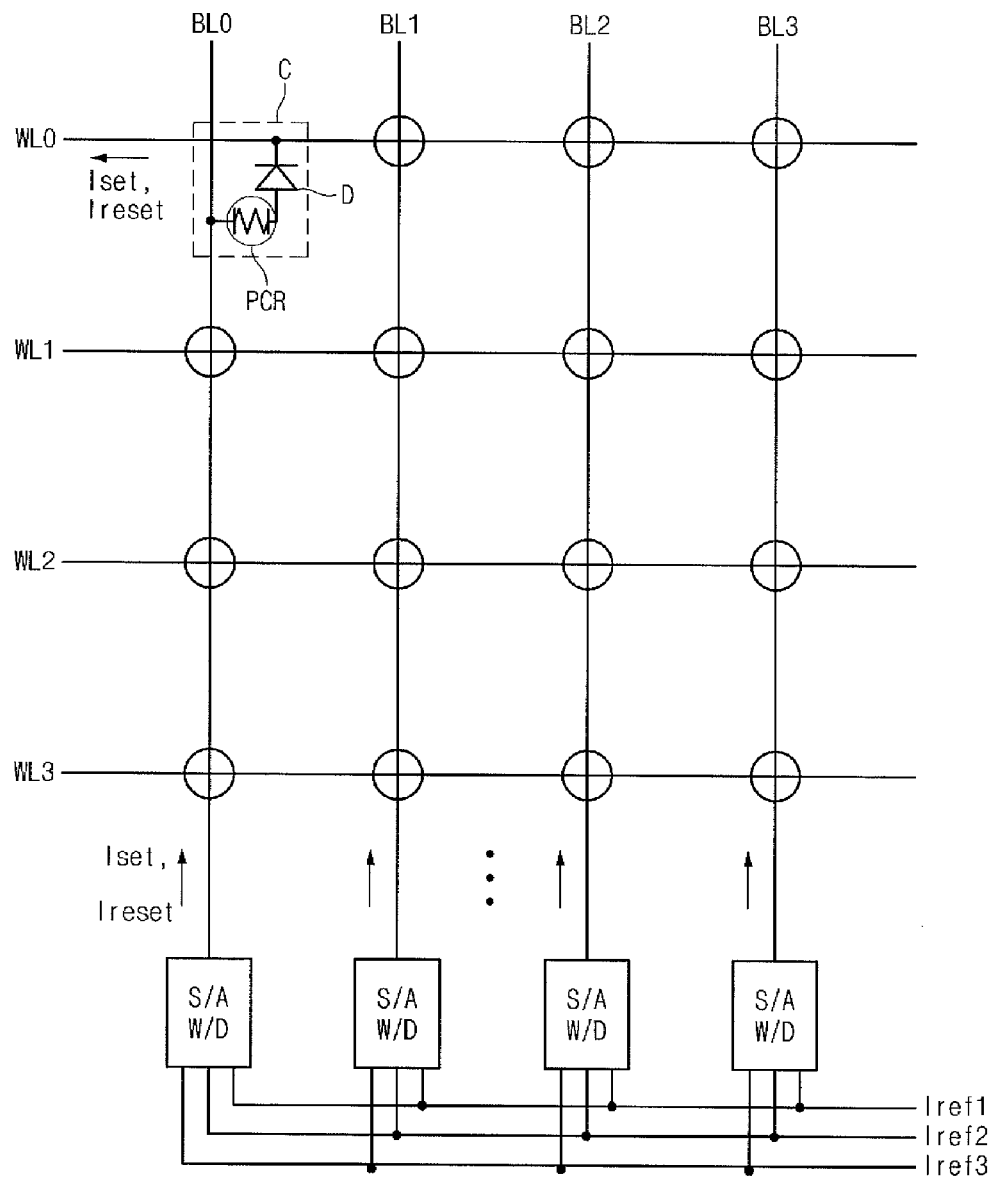
FIG. 4 is a diagram showing a cell array of a phase change memory according to an embodiment of the present invention.

FIG. 4 is a diagram showing a phase change memory device according to an embodiment of the present invention.

The phase change memory device includes a plurality of bit lines BL0~BL3 arranged in a row direction and a plurality of word lines WL0~WL3 arranged in a column direction. A unit cell C is arranged at an intersection of the bit lines BL0~BL3 the word lines WL0~WL3. The unit cell C includes a phase change resistor PCR and a diode D. The diode D includes a PN diode element.

The phase change resistor PCR has one electrode connected to the bit line BL and the other electrode connected to a P-type region of the diode D. A N-type region of the diode D is connected to the word line WL.

A low voltage is applied to a selected word line WL in a read mode. A read voltage Vread is applied to the bit line BL so that a read current Iset having a set state and a read current Ireset having a reset state, flow toward the word line WL through the bit line BL, the phase change resistor PCR, and the diode D.

A sense amplifier S/A senses cell data received through the bit line BL and compares the cell data with reference currents Iref1~Iref3 to distinguish between multi-level data "11", "10", "01" and "00". The reference currents Iref1~Iref3 represent currents flowing in reference lines to sense a 4-level, 2-bit cell current. A write driving unit W/D supplies a driving voltage, which corresponds to write data, to the bit line BL when data is written to cells.

In order to distinguish between the 2 bit data "11", "10", "01" and "00", an embodiment of the present invention requiring the reference currents Iref1~Iref3 is explained. However, the present invention is not limited herein to only 2 bit data. The present invention may be adapted such that 'n' bit data can be read and written. When the number of set and data bits is 'n', the sensing level of the set and reset data can be extended to $2^n$ levels, wherein 'n' is a natural number and the number of bit data.

Figure 5:
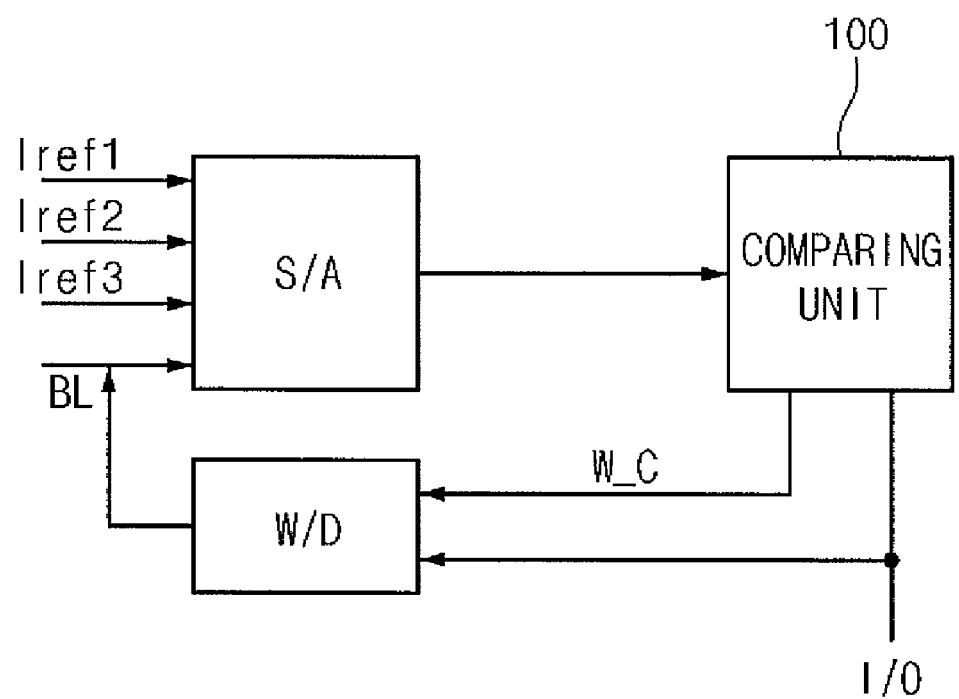
FIG. 5 is a diagram showing a sense amplifier, a write driving unit, and a comparing unit of FIG. 4.

FIG. 5 is a diagram showing the sense amplifier S/A, the write driving unit W/D, and a comparing unit 100 of FIG. 4.

The sense amplifier S/A compares the reference currents Iref1~Iref3 to the cell data received through the bit line BL. The write driving unit W/D supplies a driving voltage, which corresponds to write data, to the bit line BL when data is written to the cells. The comparing unit 100 compares multi-level write data received from input/output lines I/O to cell read data outputted from the sense amplifier S/A and outputs a write control signal W_C.

That is, the comparing unit 100 deactivates the write control signal W_C when the multi-level write data received from the input/output lines I/O is identical to the cell read data outputted from the sense amplifier S/A. The write driving unit W/D is stopped when the write control signal W_C is deactivated.

The comparing unit 100 activates the write control signal W_C when the multi-level write data received from the input/output lines I/O is not identical to the cell read data outputted from the sense amplifier S/A. The write driving unit W/D operates according to the write control signal W_C and writes new data through the bit line BL to the cell.

Figure 6:
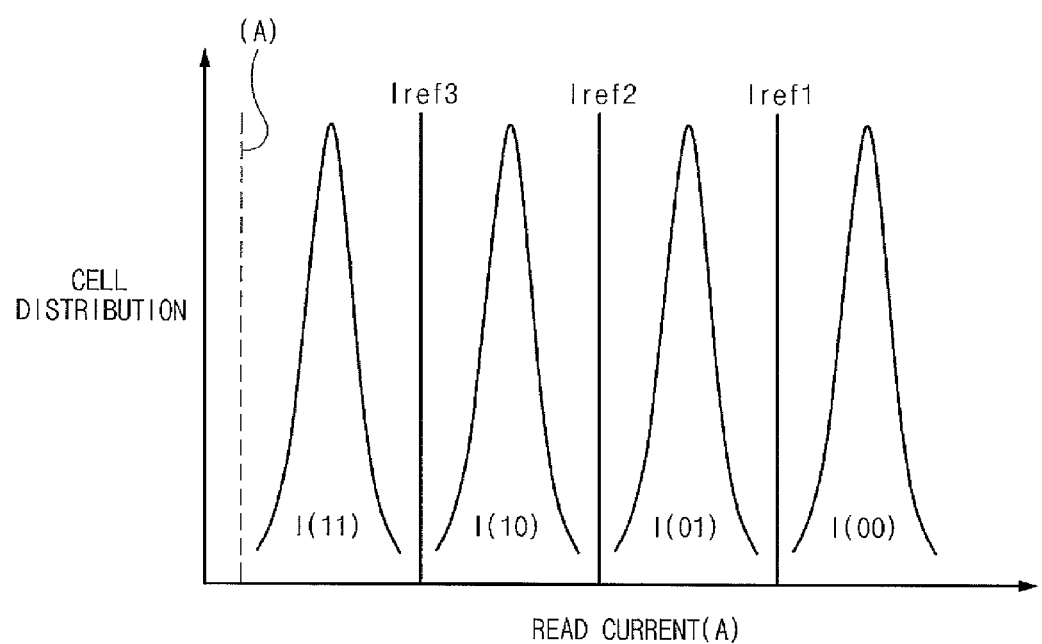
FIG. 6 is a diagram showing the distribution of cell characteristics for a 4-level, 2-bit storage phase change memory device according to an embodiment of the present invention.

FIG. 6 is a diagram showing the distribution of cell characteristics for a 4-level, 2-bit storage phase change memory device according to an embodiment of the present invention. FIG. 6 shows a 2-bit storage cell distribution characteristic for storing 4 levels based on varying read currents.

The largest cell read current flows for a data "00" level. The second largest cell read current flows for a data "01" level. The third largest cell read current flows for a data "10" level. The smallest read current flows for a data "11" level. According to a threshold current value (A) where the smallest current flows, a high resistance reset state is written over the maximum multi-level.

That is, a current I(11) flowing through the bit line BL has a read current value lower than that of the reference current Iref3. A current I(10) flowing through the bit line BL has a read current value higher than that of the reference current Iref3 and lower than that of the reference current Iref2.

A current I(01) flowing through the bit line BL has a read current value higher than that of the reference current Iref2 and lower than that of the reference current Iref1. A current I(00) flowing through the bit line BL has a read current value higher than that of the reference current Iref1. The read reset current Ireset has a read current value lower than that of the reference current Iref.

The current I(00) corresponding to the data "00" level has a current level close to a set state, and the current I(11) corresponding to the data "11" has a current level close to a reset state. The reference currents Iref1~Iref3 flow between the 4-level regions to read or write cell data.

Figure 7:
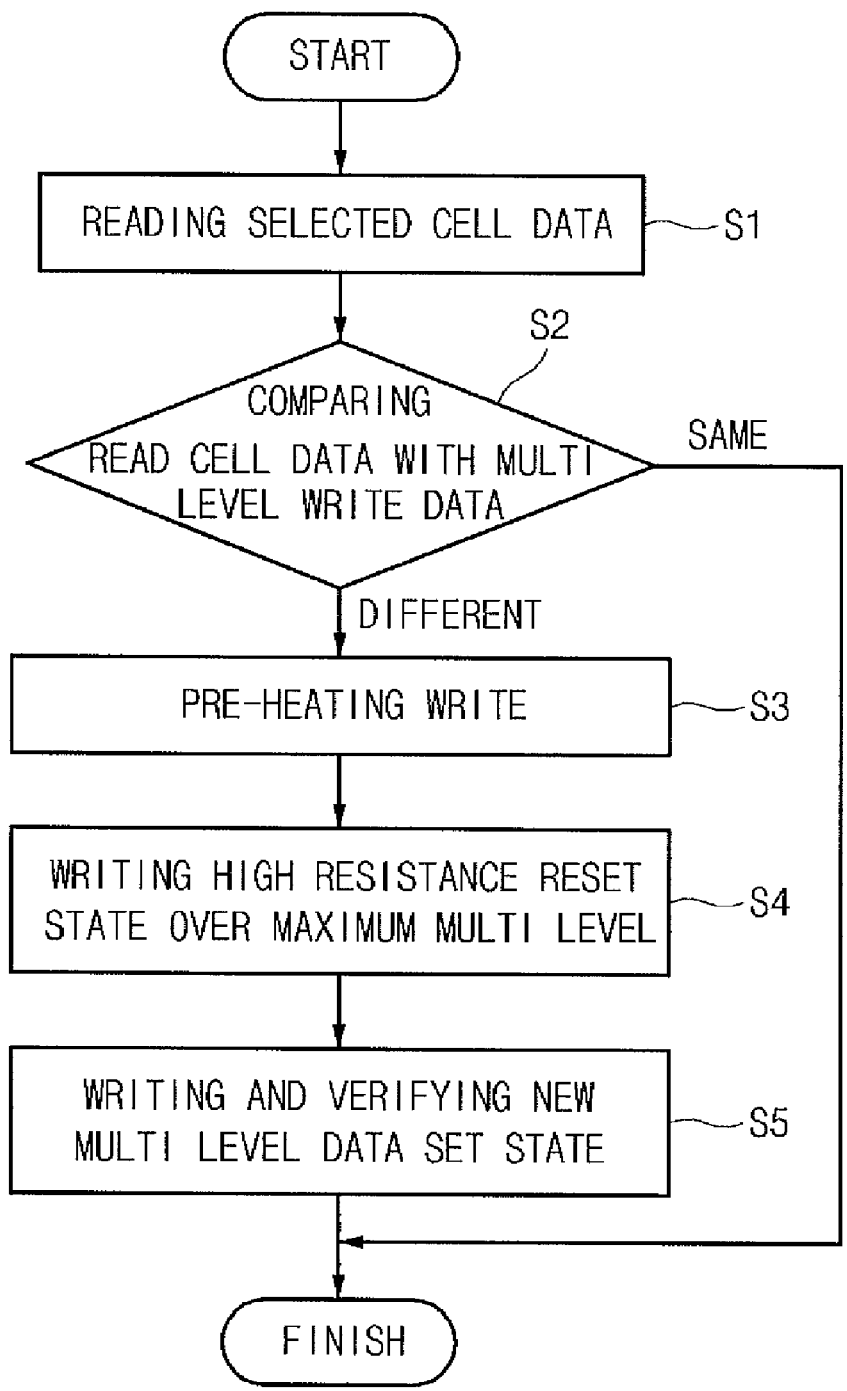
FIG. 7 is a flow chart illustrating a method for driving a write cycle of a phase change memory device according to an embodiment of the present invention.

FIG. 7 is a flow chart illustrating a method for driving a write cycle of a phase change memory device according to an embodiment of the present invention.

When a multi-level write cycle starts, data of the selected unit cell C is read to read the original data stored in the unit cell C (step S1). The sense amplifier S/A compares the reference currents Iref1~Iref3 to the cell data "11", "10", "01", "00" received through the bit line BL and amplifies the data.

That is, a low voltage is transmitted to the selected word line WL in a read mode. A read voltage Vread is transmitted to the bit line BL so that the currents I(11), I(10), I(01), and I(00) flow toward the word line WL through the bit line BL, the phase change resistor PCR, and the diode D.

The comparing unit 100 compares the multi-level write data received from the input/output lines I/O to the read data read from the sense amplifier S/A and outputs the write control signal W_C (step S2).

That is, the comparing unit 100 deactivates the write control signal W_C when a logic value of the multi-level write data received from the input/output lines I/O is identical to the logic value of the cell data outputted from the sense amplifier S/A. When the write control signal W_C is deactivated, the write driving unit W/D is stopped and no new data is written.

When a logic value of the multi-level write data received from the input/output lines I/O is identical to the cell data outputted from the sense amplifier S/A, the data to be written is determined to be already stored in the cell and therefore there is no need to perform a new write operation. As a result, the number of reset and set write operations can be reduced.

Conversely, the comparing unit 100 activates the write control signal W_C when a logic value of the multi-level write data received from the input/output lines I/O is not identical to the cell data outputted from the sense amplifier S/A. When the write control signal W_C is activated, the write driving unit W/D operates and writes new data through the bit line BL. As a result, the write driving unit W/D supplies a driving voltage, which corresponds to write data, to the bit line BL when data is to be written to the cell.

Figure 8:
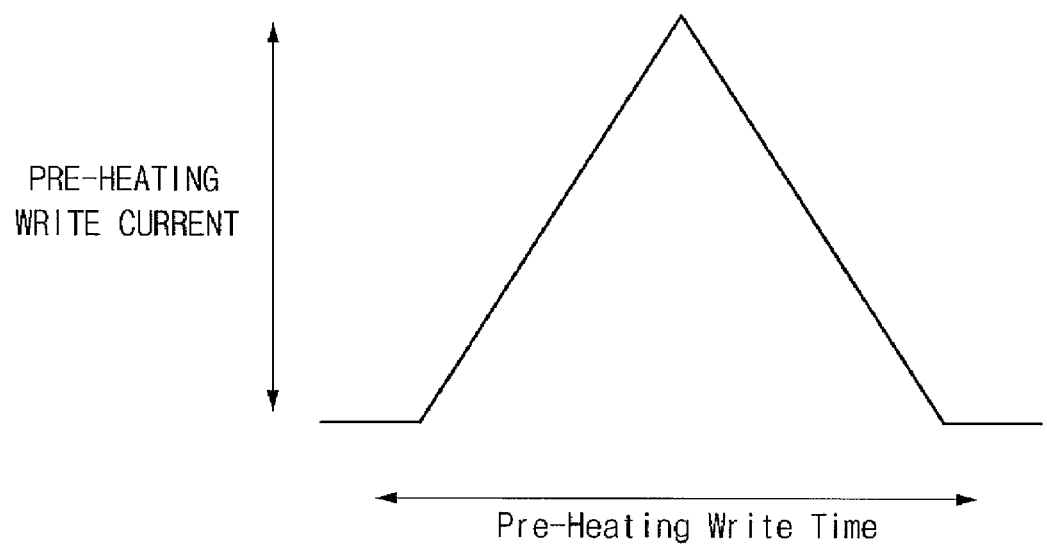
FIG. 8 is a diagram showing an operating waveform of a pre-heating write current referenced in the method of FIG. 7.

When the write control signal W_C is activated, a pre-heating write current for preheating the unit cell is applied as shown in FIG. 8 (see step S3). The pre-heating write current is generated by the driving voltage of the write driving unit W/D. As shown in FIG. 8, the pre-heating write current may be transmitted as a triangular waveform that gradually rises to a given current level and gradually falls after the current reaches a target current value.

The pre-heating write current causes a heat annealing effect of the phase change resistor PCR. As a result, the reliability and endurance of the phase change resistor PCR is improved and the initial write condition of the phase change resistor PCR can be constantly maintained.

When the write control signal W_C is activated, the pre-heating write current is applied to the bit line BL to warm up the phase change resistor PCR of the unit cell C. As a result, a first write condition may operate normally.

A high resistance reset state is written over the maximum multi-level so that a threshold current value (A) having the smallest current level flows in the unit cell (step S4). That is, a write voltage having the data "11" level or more is supplied to the bit line BL to write the high resistance reset state so that the phase change resistor PCR of the unit cell C to be written has a high resistance state.

The write driving unit W/D writes a set state for the new multi-level data to perform a verification operation (step S5). That is, the set state condition for the multi-level write operation is changed and the verification operation is repeated until the new multi-level data is written normally.

Figure 9:
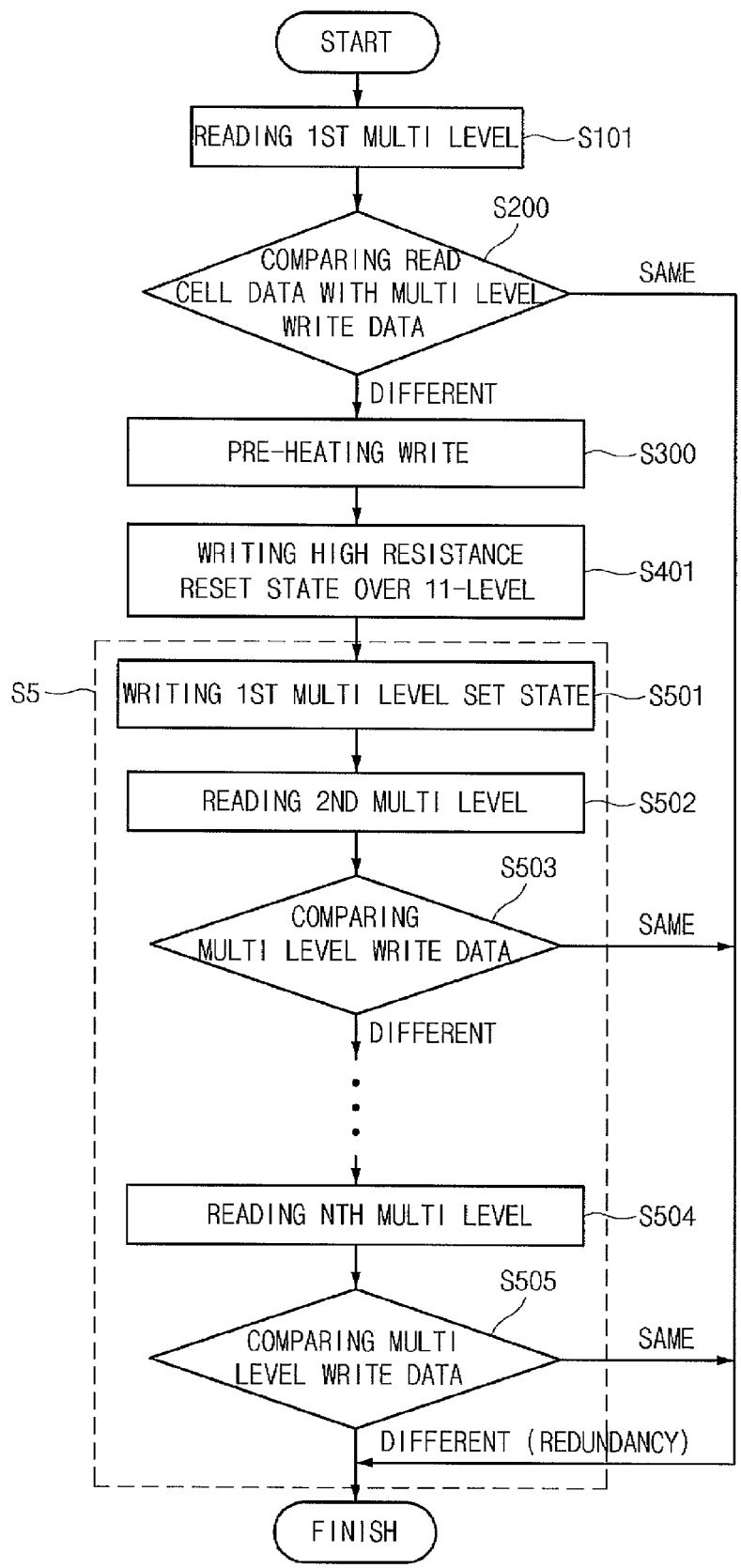
FIG. 9 is a flow chart illustrating a method for driving a 4-level, 2-bit write cycle of a phase change memory device according to an embodiment of the present invention.

FIG. 9 is a flow chart illustrating a method for driving a 4-level, 2-bit write cycle of a phase change memory device according to an embodiment of the present invention.

When a multi-level write cycle starts, multi-level data of the first selected unit cell C is read to read the original data stored in the unit cell C (step S101).

The comparing unit 100 compares multi-level write data received from the input/output lines I/O with the cell data read from the sense amplifier S/A (step S200).

The write operation is finished when the multi-level write data received from the input/output lines I/O is identical to the cell data read from the sense amplifier S/A. A pre-heating write current for preheating the unit cell C is applied to the unit cell C when the multi-level write data received from the input/output lines I/O is not identical to the cell data read from the sense amplifier S/A (step S300).

A write voltage having the data "11" level or more is supplied to the bit line BL to write the high resistance reset state so that the phase change resistor PCR of the unit cell C to be written has a high resistance state (step S401).

The write driving unit W/D writes a set state for the new multi-level data to perform a verification operation (step S5). The write and verification operations for the new multi-level data includes repeating the writing, reading, and verifying steps for a plurality of set states.

That is, a write voltage is supplied to the unit cell C to write a multi-level set state according to a first condition (step S501). The multi-level data stored in the corresponding unit cell C is then read and verified (step S502).

The comparing unit 100 compares multi-level write data received from the input/output lines I/O with the cell data read from the sense amplifier S/A (step S503). The write operation is finished when the multi-level write data received from the input/output lines I/O is identical to the cell data read from the sense amplifier S/A.

When the multi-level write data received from the input/output lines I/O is different from the cell data read from the sense amplifier S/A, a write condition set state is changed to write a multi-level set state according to a second condition.

The comparing unit 100 compares the multi-level write data received from the input/output lines I/O with the cell data read from the sense amplifier S/A. When the data is the same, the write operation is finished.

When the multi-level write data received from the input/output lines I/O is different from the cell data read from the sense amplifier S/A, the write condition set state is changed to write a multi-level set state according to an $n^{th}$ condition.

The $n^{th}$ multi-level data stored in the corresponding unit cell C is then read (step S504). That is, n set states having changing write conditions are written and read repeatedly.

The comparing unit 100 compares the multi-level write data received from the input/output lines I/O to the cell data read from the sense amplifier S/A (step S505). When the multi-level write data received from the input/output lines I/O is identical to the cell data read from the sense amplifier S/A, the write operation is finished.

When the multi-level write data received from the input/output lines I/O is different from the cell data read from the sense amplifier S/A after the $n^{th}$ condition, the write operation is finished and a redundancy operation is performed. Although n write/read operations are repeated, a redundancy circuit can rescue failed cells.

Figure 10:
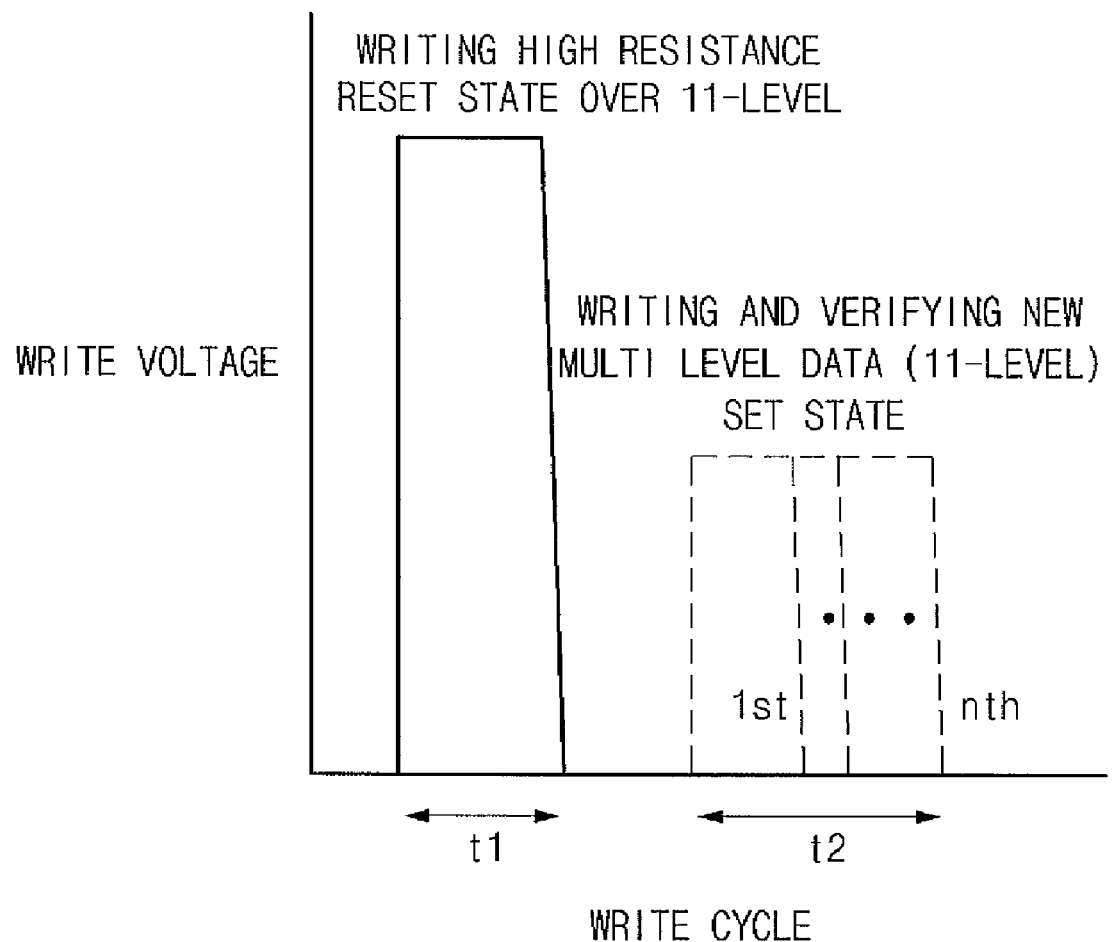
FIG. 10 is a diagram showing an "11"-level write method in a 4-level, 2-bit write driving method according to an embodiment of the present invention.

FIG. 10 is a diagram showing a "11"-level write method in a 4-level, 2-bit write driving method according to an embodiment of the present invention.

In order to write 4-level, 2-bit data, a write voltage for the data "11" level or more is supplied to the bit line BL during a period t1 to write a high reset state. The phase change resistor PCR of the unit cell C to be written is at a high resistance state so that a threshold value (A) for distinguishing data is set.

In a period t2, the write driving unit W/D supplies a write voltage to the unit cell C to write and verify a set state for the new multi-level data "11". That is, while the write voltage is maintained at the data "11" level, a write condition for a set state is changed to a set time. The write condition of a set state in the multi-level write operation is changed several times by adjusting a set time, such that the verification operation is repeated until the new multi-level data is written normally.

In a write operation for a first set state, when a data "11" level fails based on the reference currents, a set time increases by a first step. That is, the set time is adjusted longer so that a write operation having a second set state is performed. In this way, the set time is increased to the $n^{th}$ step, and data "11" is written normally to the cells where the data "11" level fails to be written.

Figure 11:
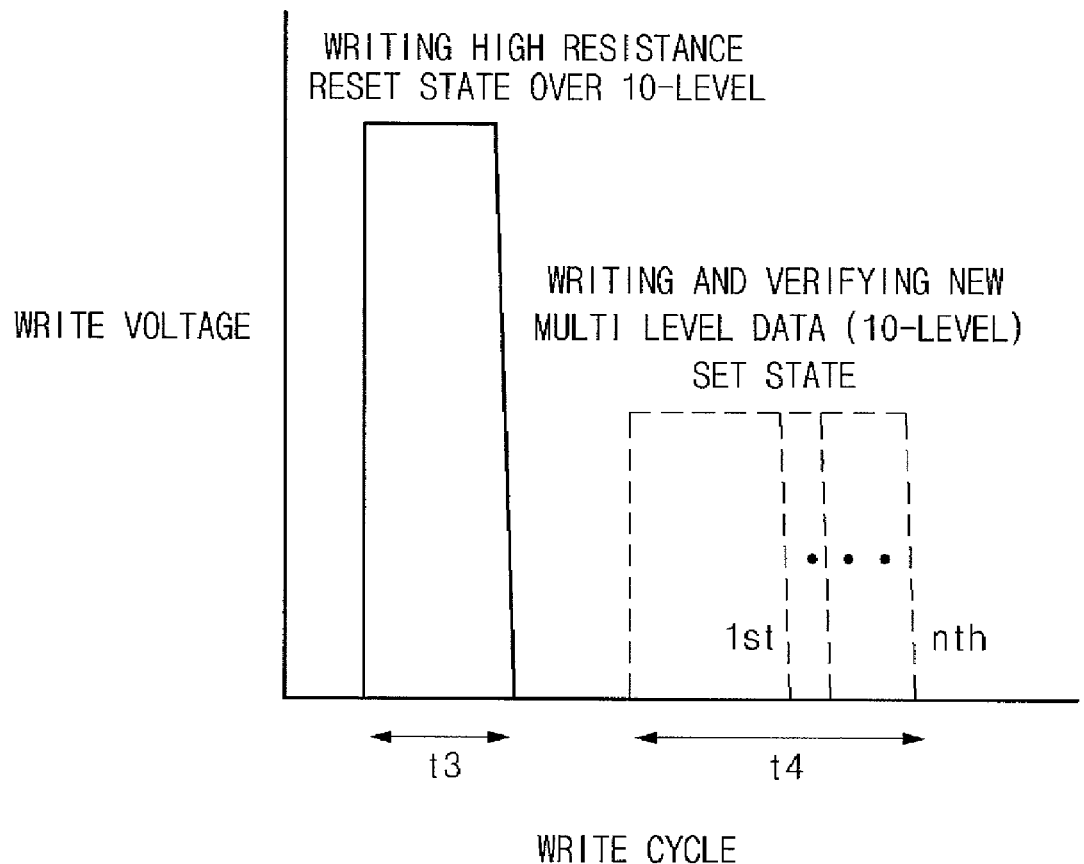
FIG. 11 is a diagram showing a "10"-level write method in a 4-level, 2-bit write driving method according to an embodiment of the present invention.

FIG. 11 is a diagram showing a "10"-level write method in a 4-level, 2-bit write driving method according to an embodiment of the present invention.

In order to write 4-level, 2-bit data, a write voltage for the data "10" level or more is supplied to the bit line BL during a period t3 to write a high reset state. The phase change resistor PCR of the unit cell C to be written is at a high resistance state so that a voltage value for distinguishing data is set.

In a period t4, the write driving unit W/D supplies a write voltage to the unit cell C to write and verify a set state for the new multi-level data "10". A time t4 is longer than a time t2.

That is, while the write voltage is maintained at the data "10" level, a write condition for a set state is changed to a set time. The write condition having a set state in the multi-level write operation is changed several times by adjusting a set time, such that the verification operation is repeated until the new multi-level data is written normally.

In a write operation for a first set state, when a data "10" level fails based on the reference currents, a set time increases by a first step. That is, the set time is adjusted longer so that a write operation having a second set state is performed. In this way, the set time is increased to the $n^{th}$ step, and data "10" is written normally to the cells where the data "10" level fails to be written.

Figure 12:
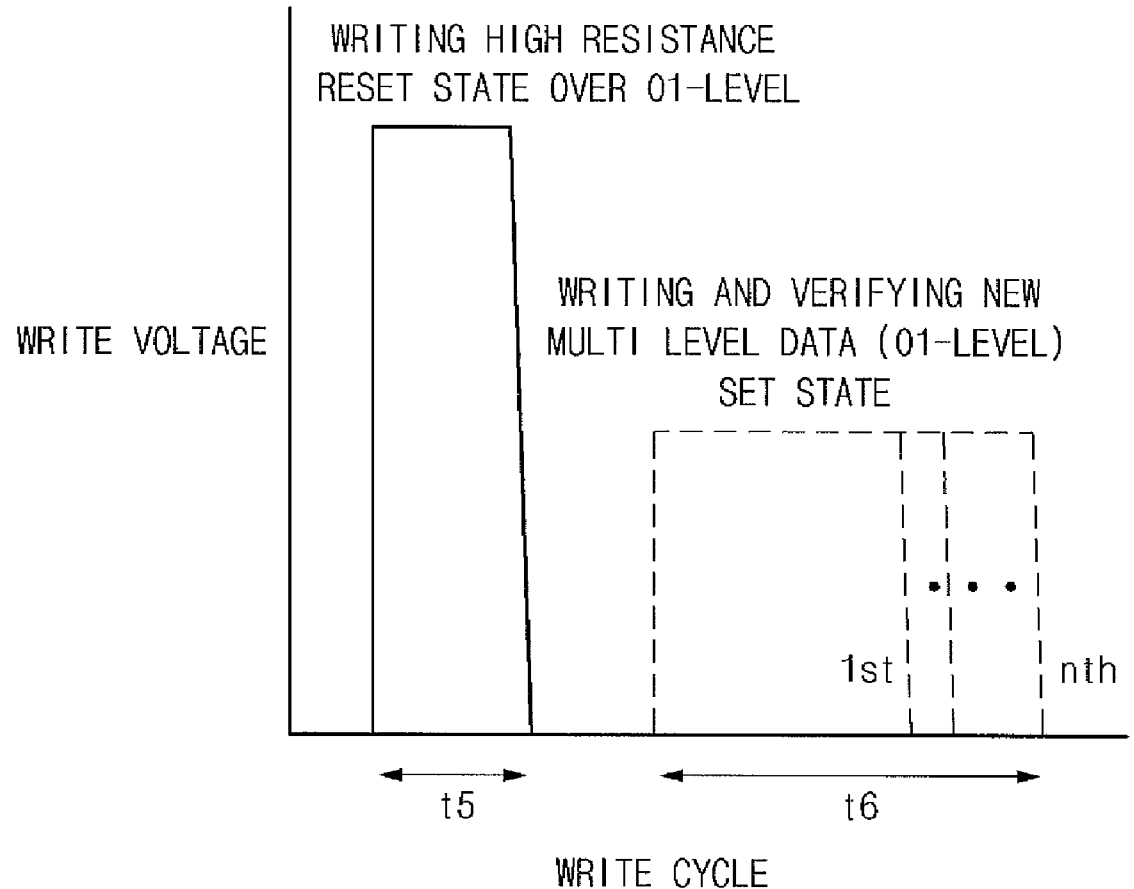
FIG. 12 is a diagram showing a "01"-level write method in a 4-level, 2-bit write driving method according to an embodiment of the present invention.

FIG. 12 is a diagram showing a "01"-level write method in a 4-level, 2-bit write driving method according to an embodiment of the present invention.

In order to write 4-level, 2-bit data, a write voltage for the data "01" level or more is supplied to the bit line BL during a period t5 to write a high reset state. The phase change resistor PCR of the unit cell C to be written is at a high resistance state so that a voltage value for distinguishing data is set.

In a period t6, the write driving unit W/D supplies a write voltage to the unit cell C to write and verify a set state for the new multi level data "01". A time t6 is longer than a time t4.

That is, while the write voltage is maintained at the data "01" level, a write condition for a set state is changed to a set time. The write condition having a set state in the multi-level write operation is changed several times by adjusting a set time, such that the verification operation is repeated until the new multi-level data is written normally.

In a write operation for a first set state, when a data "01" level fails based on the reference currents, a set time increases by a first step. That is, the set time is adjusted longer so that a write operation having a second set state is performed. In this way, the set time is increased to the $n^{th}$ step, and data "01" is written normally to the cells where the data "01" level fails to be written.

Figure 13:
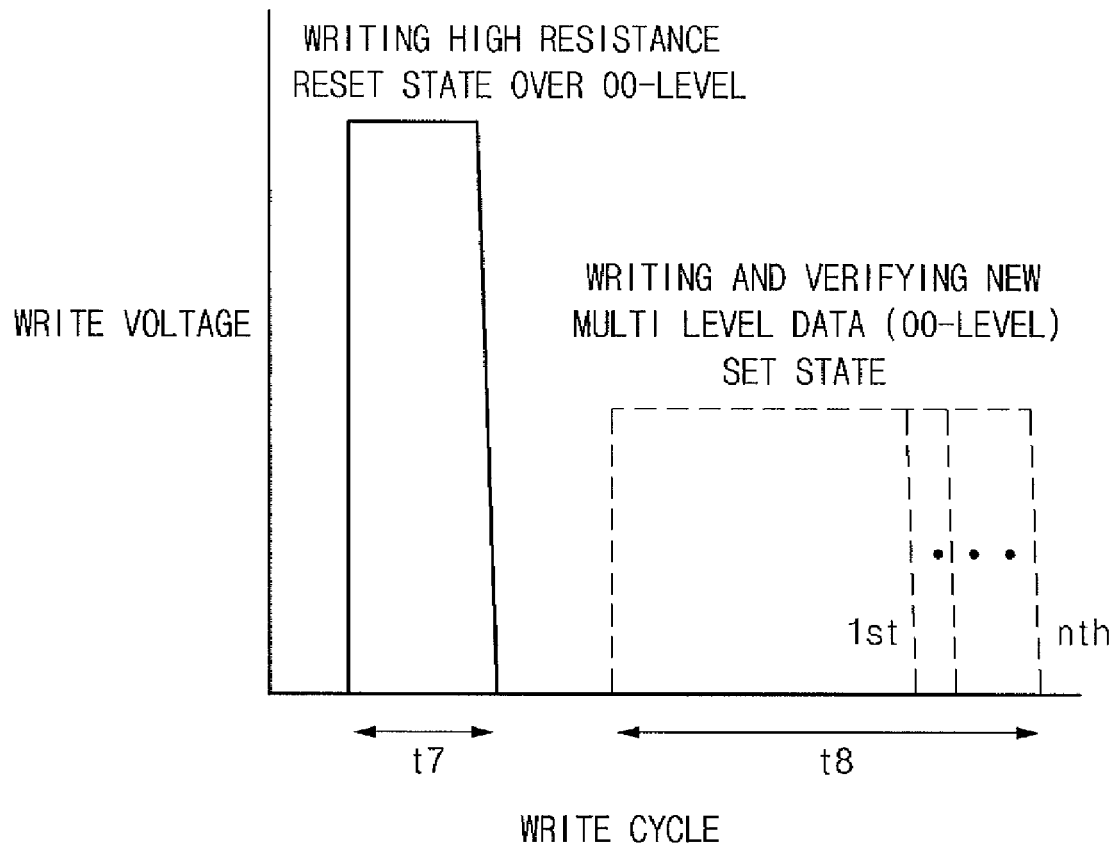
FIG. 13 is a diagram showing a "00"-level write method in a 4-level, 2-bit write driving method according to an embodiment of the present invention.

FIG. 13 is a diagram showing a "00"-level write method in a 4-level, 2-bit write driving method according to an embodiment of the present invention.

In order to write 4-level, 2-bit data, a write voltage for the data "00" level or more is supplied to the bit line BL during a period t7 to write a high reset state. The phase change resistor PCR of the unit cell C to be written is at a high resistance state so that a voltage value for distinguishing data is set.

In a period t8, the write driving unit W/D supplies a write voltage to the unit cell C to write and verify a set state for the new multi level data "00". A time t8 is longer than a time t6.

That is, while the write voltage is maintained at the data "00" level, a write condition for a set state is changed to a set time. The write condition having a set state in the multi-level write operation is changed several times by adjusting a set time, such that the verification operation is repeated until the new multi-level data is written normally.

In a write operation for a first set state, when a data "00" level fails based on the reference currents, a set time increases by a first step. That is, the set time is adjusted longer so that a write operation having a second set state is performed. In this way, the set time is increased to the $n^{th}$ step, and data "00" is written normally to the cells where the data "00" level fails to be written.

As described above, a method according to an embodiment of the present invention comprises reading/writing multi-level data to a phase change memory device having a phase change resistor.

Using the phase change memory device having the phase change resistor according to an embodiment of the present invention reduces the number of reset and set operations needed and improves a write operation characteristic of the phase change memory device.

According to an embodiment of the present invention, when an initial cell's write characteristic is different, a multi-level write condition may be changed to obtain a normal multi-level write condition.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combinations arrangement within the scope of the disclosure, the drawings and the appended claims. In addition to variations and modifications in the component parts and/or arrangements, alternative uses will also be apparent to those skilled in the art.

What is claimed is:

1. A method for driving a phase change memory device having a phase change resistor and sensing a change in a crystallization state of the phase change resistor according to currents applied to the phase change resistor to store data corresponding to the crystallization state, the method comprising:
   reading cell data of a selected cell;
   comparing the cell data with multi-level data to be written to the cell;
   applying a write voltage corresponding to a threshold voltage to the cell to write a high resistance reset state to the phase change resistor when the cell data is different from the multi-level data; and
   writing and verifying a set state corresponding to the multi-level data,
      wherein the writing and verifying step comprises:
      writing a set state corresponding to the multi-level data to the cell;
      reading a multi-level cell data stored in the cell;
      comparing the multi-level data to the multi-level cell data;
      repeating the writing step, the reading step, and the comparing step; and
      performing a redundancy operation after the writing step when an $n^{th}$ multi-level data is different from a $n^{th}$ multi-level cell data,
      wherein the writing and verifying step is repeated until the multi-level data is identical to the multi-level cell data.

2. The method according to claim 1, wherein the write voltage corresponding to the threshold voltage has a voltage value greater than a voltage value of the multi-level data.

3. The method according to claim 1, wherein the multi-level data is 4-level and 2 bit data.

4. The method according to claim 1, wherein the write voltage corresponding to the threshold voltage corresponds to a reset voltage greater than a voltage value of a data "11" level.

5. The method according to claim 3, wherein the write voltage corresponding to the threshold voltage corresponds to a reset voltage greater than a voltage value of a data "11" level.

6. The method according to claim 3, wherein the multi-level data is read according to three different reference currents.

7. The method according to claim 1, further comprising:
stopping a write operation when the cell data is the same as the multi-level data.

8. The method according to claim 1, wherein the writing and verifying step includes changing a set state condition for the multi-level data.

9. The method according to claim 8, wherein the writing and verifying step further comprises the step of:
writing the multi-level data by adjusting a time the multi-level data is applied to the cell while maintaining a constant write voltage of the multi-level data.

10. The method according to claim 1, wherein the writing and verifying step further comprises the step of:
writing and verifying data "11", "10", "01" and "00" sequentially.

11. The method according to claim 9, wherein the writing and verifying step further comprises the step of:
writing and verifying data "11", "10", "01" and "00" sequentially.

12. A method for driving a phase change memory device having a phase change resistor and sensing a change in a crystallization state of the phase change resistor according to currents applied to the phase change resistor to store data corresponding to the crystallization state, the method comprising:
reading cell data of a selected cell;
comparing the cell data with multi-level data to be written to the cell;
preheating the phase change resistor by supplying a preheating write current to the phase change resistor when the cell data is different from the write data;
applying a write voltage corresponding to a threshold voltage to the cell to write a high resistance reset state to the phase change resistor when the cell data is different from the multi-level data; and
writing and verifying a set state corresponding to the multi-level data.

13. The method according to claim 12, wherein the preheating step is performed after comparing the cell data with the multi-level data.

14. The method according to claim 12, wherein the preheating write current is applied to the phase change resistor as a triangular waveform.

15. The method according to claim 1, wherein the multi-level data is "n" bit data, and a sensing level of the multi-level data is one of $2^n$ levels.

16. The method according to claim 12, wherein the write voltage corresponding to the threshold voltage has a voltage value greater than a voltage value of the multi-level data.

17. The method according to claim 12, wherein the multi-level data is 4-level and 2 bit data.

18. The method according to claim 12, wherein the write voltage corresponding to the threshold voltage corresponds to a reset voltage greater than a voltage value of a data "11" level.

19. The method according to claim 17, wherein the write voltage corresponding to the threshold voltage corresponds to a reset voltage greater than a voltage value of a data "11" level.

20. The method according to claim 17, wherein the multi-level data is read according to three different reference currents.

21. The method according to claim 12, further comprising:
stopping a write operation when the cell data is the same as the multi-level data.

22. The method according to claim 12, wherein the writing and verifying step comprises:
writing a set state corresponding to the multi-level data to the cell;
reading a multi-level cell data stored in the cell; and
comparing the multi-level data to the multi-level cell data.

23. The method according to claim 22, further comprising the step of:
repeating the writing step, the reading step, and the comparing step.

24. The method according to claim 23, wherein the writing and verifying step is repeated until the multi-level data is identical to the multi-level cell data.

25. The method according to claim 24, further comprising the step of:
performing a redundancy operation after the writing step when an $n^{th}$ multi-level data is different from a $n^{th}$ multi-level cell data.

26. The method according to claim 12, wherein the writing and verifying step includes changing a set state condition for the multi-level data.

27. The method according to claim 26, wherein the writing and verifying step further comprises the step of:
writing the multi-level data by adjusting a time the multi-level data is applied to the cell while maintaining a constant write voltage of the multi-level data.

28. The method according to claim 12, wherein the writing and verifying step further comprises the step of:
writing and verifying data "11", "10", "01" and "00" sequentially.

29. The method according to claim 27, wherein the writing and verifying step further comprises the step of:
writing and verifying data "11", "10", "01" and "00" sequentially.

* * * * *